United States Patent

Kan

(10) Patent No.: US 8,872,590 B2
(45) Date of Patent: Oct. 28, 2014

(54) LOW-NOISE SIGNAL AMPLIFYING CIRCUIT AND METHOD THEREOF

(71) Applicant: Rafael microelectronics, Inc., Hsinchu (TW)

(72) Inventor: Meng-Ping Kan, Hsinchu (TW)

(73) Assignee: Rafael microelectronics, Inc., Hsinchu (TW)

( * ) Notice: Subject to any disclaimer, the term of this patent is extended or adjusted under 35 U.S.C. 154(b) by 93 days.

(21) Appl. No.: 13/786,464

(22) Filed: Mar. 6, 2013

(65) Prior Publication Data

US 2014/0253239 A1    Sep. 11, 2014

(51) Int. Cl.
*H03G 3/10* (2006.01)
*H03F 3/193* (2006.01)

(52) U.S. Cl.
CPC ........................................ *H03F 3/193* (2013.01)
USPC .......................................... 330/284; 330/311

(58) Field of Classification Search
USPC ................ 330/284, 311, 310, 124 R, 295
See application file for complete search history.

(56) References Cited

U.S. PATENT DOCUMENTS

| | | | | |
|---|---|---|---|---|
| 5,155,449 A * | 10/1992 | Ito | | 330/277 |
| 7,183,842 B1 * | 2/2007 | Wai et al. | | 330/98 |
| 7,652,539 B2 * | 1/2010 | Gao et al. | | 330/311 |
| 7,737,789 B2 * | 6/2010 | Eisenstadt et al. | | 330/311 |
| 8,686,796 B2 * | 4/2014 | Presti | | 330/311 |

\* cited by examiner

*Primary Examiner* — Henry Choe
(74) *Attorney, Agent, or Firm* — Winston Hsu; Scott Margo

(57) ABSTRACT

A signal amplifying circuit includes: a first transistor having a first connecting terminal coupled to an input signal, and a controlling terminal coupled to a first reference voltage; an adjustable resistive circuit having a first terminal coupled to a second connecting terminal of the first transistor; and a second transistor having a first connecting terminal coupled to a second terminal of the adjustable resistive circuit, a controlling terminal coupled to a second reference voltage, and a second connecting terminal for outputting an output signal corresponding to the input signal; wherein a resistance of the adjustable resistive circuit is adjusted to make an input impedance looking into the first transistor from the first connecting terminal equal a predetermined impedance.

17 Claims, 6 Drawing Sheets

LOW-NOISE SIGNAL AMPLIFYING CIRCUIT AND METHOD THEREOF

BACKGROUND OF THE INVENTION

1. Field of the Invention

The present invention relates to a low-noise signal amplifying circuit and method thereof, and more particularly to a low-noise amplifier having low noise-figure and low return loss and the related method.

2. Description of the Prior Art

In a wireless communication system, the LNA provides the first level of amplification of the RF signal received at the system's antenna. Therefore, the main function of the LNA is to amplify the extremely low RF signals without adding noise, thus preserving the required signal-to-noise ratio (SNR) of the system at extremely low power levels. Moreover, when the LNA is arranged to receive the RF signal, the impedances between the input terminal of the LNA and the previous circuit stage should be matched to reduce the return loss of the RF signal. Accordingly, the LNA design presents considerable challenge due to its simultaneous requirement for high gain, low noise figure, good input and output matching and unconditional stability at the lowest possible current draw from the LNA. Proper LNA design is crucial in today's communication solutions. Due to the complexity of the signals in modern digital communications, additional design considerations need to be addressed during a LNA design procedure.

SUMMARY OF THE INVENTION

One of the objectives of the present invention is to provide a low-noise amplifier having low noise-figure and low return loss and the related method.

According to a first embodiment of the present invention, a signal amplifying circuit is disclosed. The signal amplifying circuit comprises a first transistor, an adjustable resistive circuit, and a second transistor. The first transistor has a first connecting terminal coupled to an input signal, and a controlling terminal coupled to a first reference voltage. The adjustable resistive circuit has a first terminal coupled to a second connecting terminal of the first transistor. The second transistor has a first connecting terminal coupled to a second terminal of the adjustable resistive circuit, a controlling terminal coupled to a second reference voltage, and a second connecting terminal for outputting an output signal corresponding to the input signal; wherein a resistance of the adjustable resistive circuit is adjusted to make an input impedance looking into the first transistor from the first connecting terminal equal a predetermined impedance.

According to a second embodiment of the present invention, a signal amplifying method is provided. The signal amplifying method comprises the steps of: providing a first transistor having a first connecting terminal coupled to an input signal, and a controlling terminal coupled to a first reference voltage; providing an adjustable resistive circuit having a first terminal coupled to a second connecting terminal of the first transistor; providing a second transistor having a first connecting terminal coupled to a second terminal of the adjustable resistive circuit, a controlling terminal coupled to a second reference voltage, and a second connecting terminal for outputting an output signal corresponding to the input signal; and adjusting a resistance of the adjustable resistive circuit to make an input impedance looking into the first transistor from the first connecting terminal equal a predetermined impedance.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
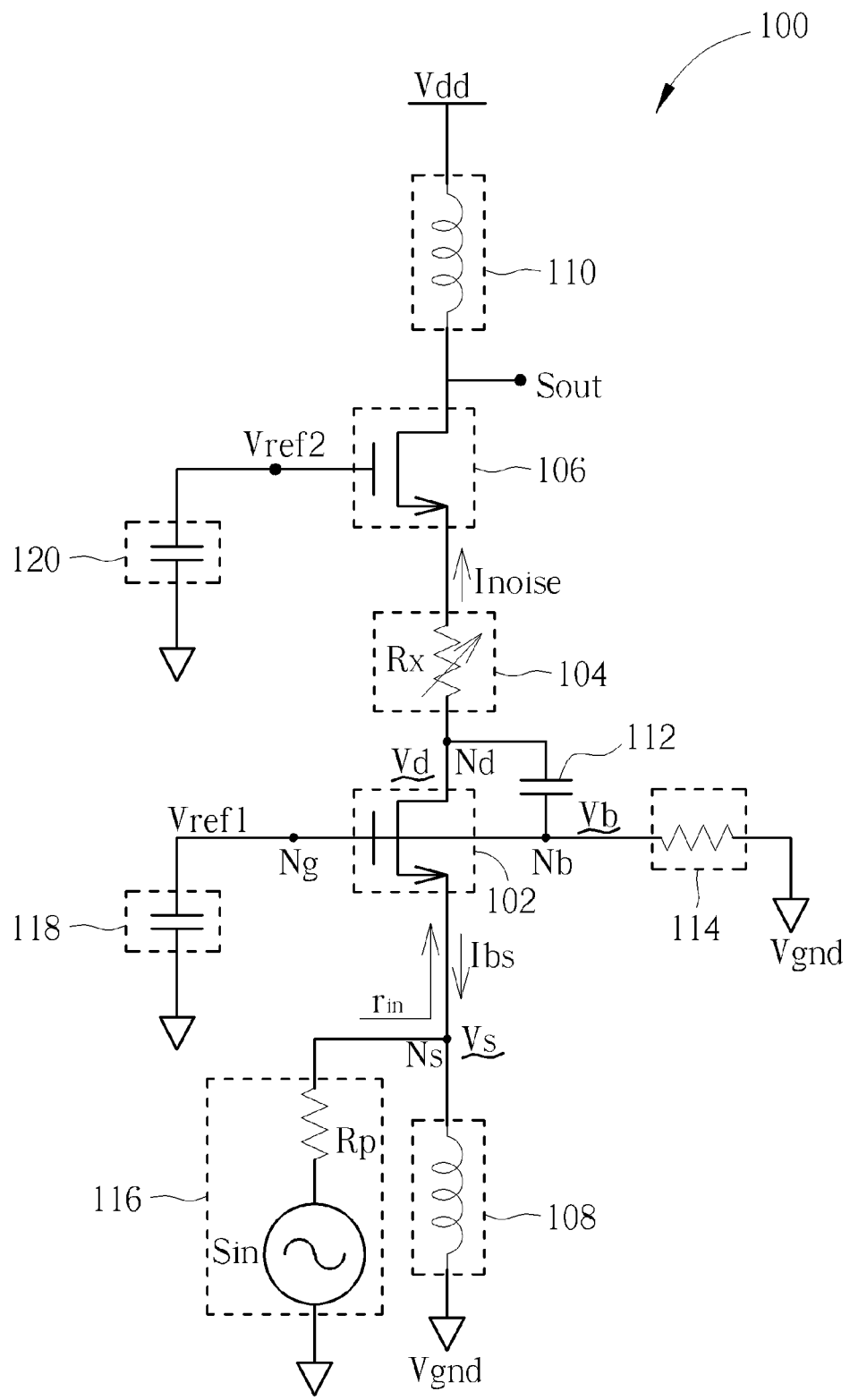
FIG. 1 is a diagram illustrating a signal amplifying circuit according to an embodiment of the present invention.

Please refer to FIG. 1, which is a diagram illustrating a signal amplifying circuit 100 according to an embodiment of the present invention. The signal amplifying circuit 100 may be a wide-band low-noise amplifier (LNA), which is arranged to receive a wide-band RF signals. This is not a limitation of the present invention, however. The signal amplifying circuit 100 comprises a first transistor 102, an adjustable resistive circuit 104, a second transistor 106, a first inductive circuit 108, a second inductive circuit 110, a capacitive circuit 112, and a resistive circuit 114. The first transistor 102 has a first connecting terminal (i.e. the source) coupled to an input signal Sin, a controlling terminal (i.e. the gate) Ng coupled to a first reference voltage Vref1. The adjustable resistive circuit 104 has a first terminal coupled to a second connecting terminal (i.e. the drain) Nd of the first transistor 102. The second transistor 106 has a first connecting terminal (i.e. the source) coupled to a second terminal of the first resistive 106, a controlling terminal (i.e. the gate) coupled to a second reference voltage Vref2, and a second connection terminal (i.e. the drain) for outputting an output signal Sout corresponding to the input signal Sin. It is noted that, for simplicity, the controlling terminal of the first transistor 102 is coupled to a capacitor 118 for providing the first reference voltage Vref1, and the controlling terminal of the second transistor 106 is coupled to another capacitor 120 for providing the second reference voltage Vref2. Moreover, the first transistor 102 may be an N-type field-effect transistor, and the second transistor 106 may be another N-type field-effect transistor, but this is not a limitation of the present invention. The first transistor 102 and the second transistor 106 may also be P-type field-effect transistors.

In addition, the first inductive circuit 108 has a first terminal coupled to the first connecting terminal Ns of the first transistor 102, and a second terminal coupled to a third reference voltage (i.e. the ground voltage) Vgnd. The second inductive circuit 110 has a first terminal coupled to the second connecting terminal of the second transistor 106, and a second terminal coupled to a fourth second reference voltage (i.e. the supply voltage) Vdd. The capacitive circuit 112 has a first terminal coupled to the second connecting terminal Nd of the first transistor 102, and a second terminal coupled to a third connecting terminal (i.e. the body) Nb of the first transistor 102. The resistive circuit 114 has a first terminal coupled to the third connecting terminal Nb of the first transistor 102, and a second terminal coupled to the third reference voltage Vgnd.

According to the embodiment of the present invention, the signal amplifying circuit 100 is a common-gate low-noise amplifier. Therefore, the input signal Sin is inputted to the source terminal of the first transistor 102, and the output signal Sout is outputted from the drain terminal of the second transistor 106. For the sake of brevity, the previous circuit stage used to generate the input signal Sin is illustrated as block 116.

During the operation of the signal amplifying circuit 100, a resistance Rx of the adjustable resistive circuit 104 is adjusted to make an input impedance $r_{in}$ looking into the first transistor 102 from the first connecting terminal Ns to equal a predetermined impedance Rp, and the predetermined impedance Rp can be set as an output impedance of the previous circuit stage 116. Therefore, the input impedance $r_{in}$ looking into the first transistor 102 from the first connecting terminal Ns is matched with the output impedance of the previous circuit stage 116. It is noted that, in this embodiment, the input impedance $r_{in}$ is arranged to substantially equal a summation of an inverse of a trans-conductance gm1 (i.e. 1/gm1) of the first transistor 102 and the resistance Rx of the adjustable resistive circuit as illustrated in the following equation (1):

$$r_{in}=(1+gmb*Rx)/(gm1+gmb) \quad (1).$$

As the input impedance $r_{in}$ substantially equals a summation of the input impedance 1/gm1 of the first transistor 102 and the resistance Rx, the weighting of the input impedance 1/gm1 in the input impedance $r_{in}$ can be reduced by increasing the weighting of the resistance Rx such that the input impedance $r_{in}$ still matches with the output impedance (i.e. Rp) of the previous circuit stage 116. In other words, in this embodiment, the first transistor 102 can be designed to have a larger trans-conductance gm1 in comparison with the conventional common-gate LNA without the adjustable resistive circuit 104. When the first transistor 102 is designed to have a large trans-conductance gm1, the noise generated by the first transistor 102 can be reduced and the linearity of the signal amplifying circuit 100 can be increased while the input impedance $r_{in}$ matches with the output impedance (i.e. Rp) of the previous circuit stage 116. Accordingly, the signal amplifying circuit 100 has the benefits of good signal-to-noise ratio (SNR) performance, good return loss performance, and good linearity performance.

To further improve the noise performance of the signal amplifying circuit 100, the resistive circuit 114 and the capacitive circuit 112 are arranged to make a first AC (Alternating current) signal vd at the second connecting terminal Nd of the first transistor 102 substantially equal a second AC signal vb at the third connecting terminal Nb of the first transistor 102. To obtain the above-mentioned effect, the resistance Rx of the adjustable resistive circuit 104 is chosen to be hundred kilo-ohms. Thus, by adding the feedback capacitor (i.e. the capacitive circuit 112) from the drain terminal (i.e. Nd) to the body (i.e. Nb) of the first transistor 102, the AC signal vb at the body (i.e. Nb) of the first transistor 102 is almost identical to the AC signal vd at the drain terminal (i.e. Nd) of the first transistor 102. Furthermore, when the AC signal vb at the body is identical to the AC signal vd at the drain terminal of the first transistor 102, the voltage level of the AC signal vb at the body of the first transistor 102 is higher than the voltage level of the input signal Sin at the source terminal (i.e. the first connecting terminal Ns) of the first transistor 102. The resistive circuit 104 and the capacitive circuit 112 are arranged to be a low-pass circuit at the second connecting terminal Nd of the first transistor 102, and a signal frequency of the input signal Sin is higher than a corner frequency of the low-pass circuit. It should be noted that the resistive circuit 104 is a user designed semiconductor resistor rather than a parasitic resistor of the first transistor 102, and the capacitive circuit 112 is a user designed semiconductor capacitor rather than a parasitic capacitor of the first transistor 102.

The following paragraph illustrates the small signal analysis of the present signal amplifying circuit 100. Please refer to FIG. 2, which is a diagram illustrating an AC signal (i.e. small signal) equivalent circuit 200 of the signal amplifying circuit 100 according to an embodiment of the present invention. The AC signal equivalent circuit 200 comprises a controllable current source 202, a controllable current source 204, a current source 206, a signal source 208, the capacitive circuit 112, the resistive circuit 114, and a resistive circuit 210. The controllable current source 202 is coupled between the first connecting terminal Ns and the second connecting terminal Nd, and the current of the controllable current source 202 is $gm1*v_{sg}$, wherein gm1 is the trans-conductance of the first transistor 102 and $v_{sg}$ is the voltage drop between the first connecting terminal Ns and the controlling terminal Ng. The controllable current source 204 is coupled between the first connecting terminal Ns and the second connecting terminal Nd, and the current of the controllable current source 202 is $gmb*v_{sb}$, wherein gmb is the trans-conductance caused by the body effect of the first transistor 102 and $v_{sb}$ is the voltage drop between the first connecting terminal Ns and the third connecting terminal Nb. The current source 206 is coupled between the first connecting terminal Ns and the second connecting terminal Nd, and the current source 206 represents the equivalent noise source of the first transistor 102, wherein the noise is equivalent to a current $i_n$. The signal source 208 is coupled to the first connecting terminal Ns, and arranged to generate an input current $i_{in}$ and an input voltage $v_{in}$ corresponding to the input signal Sin. The resistive circuit 210 is coupled between the second connecting terminal Nd and the ground voltage Vgnd, and the resistance of the resistive circuit 210 substantially equals the summation of the resistance Rx of the adjustable resistive circuit 104 and the inverse of a trans-conductance gm2 (i.e. 1/gm2) of the second transistor 106.

Figure 2:
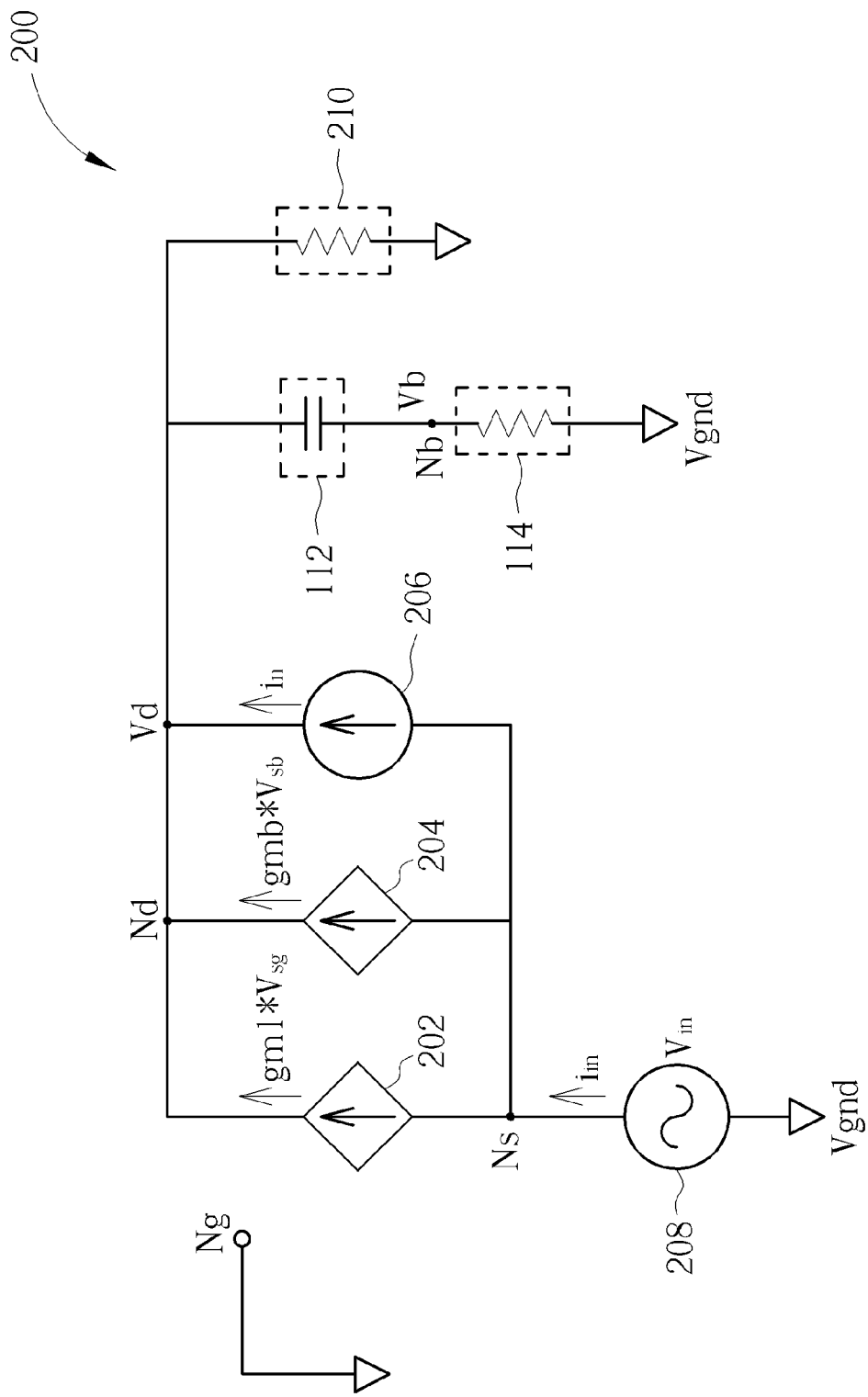
FIG. 2 is a diagram illustrating an AC signal equivalent circuit of the signal amplifying circuit according to a first embodiment of the present invention.

According to FIG. 2, the input impedance $r_{in}$ can be deduced by the following equations:

$$i_{in}=gm1*v_{in}+gmb*(v_{in}-vb);$$

$$vb=vd=i_{in}*Rx;$$

$$i_{in}=(gm1+gmb)*v_{in}/(1+gmb*Rx);$$

$$r_{in}=v_{in}/i_{in}=(1+gmb*Rx)/(gm1+gmb). \quad (2)$$

It is noted that the trans-conductance gm2 of the second transistor 106 and the noise current $i_n$ are ignored in the above deduction. Therefore, the input impedance $r_{in}$ is magnified by (1+gmb*Rx) according to equation (2). In other words, by adding the adjustable resistive circuit 104 between the drain terminal of the first transistor 102 and the source terminal of the second transistor 106, the input impedance $r_{in}$ can be adjusted by adjusting the resistance Rx of the adjustable resistive circuit 104. Accordingly, the input return loss problem of the input signal Sin can be improved.

Figure 3:
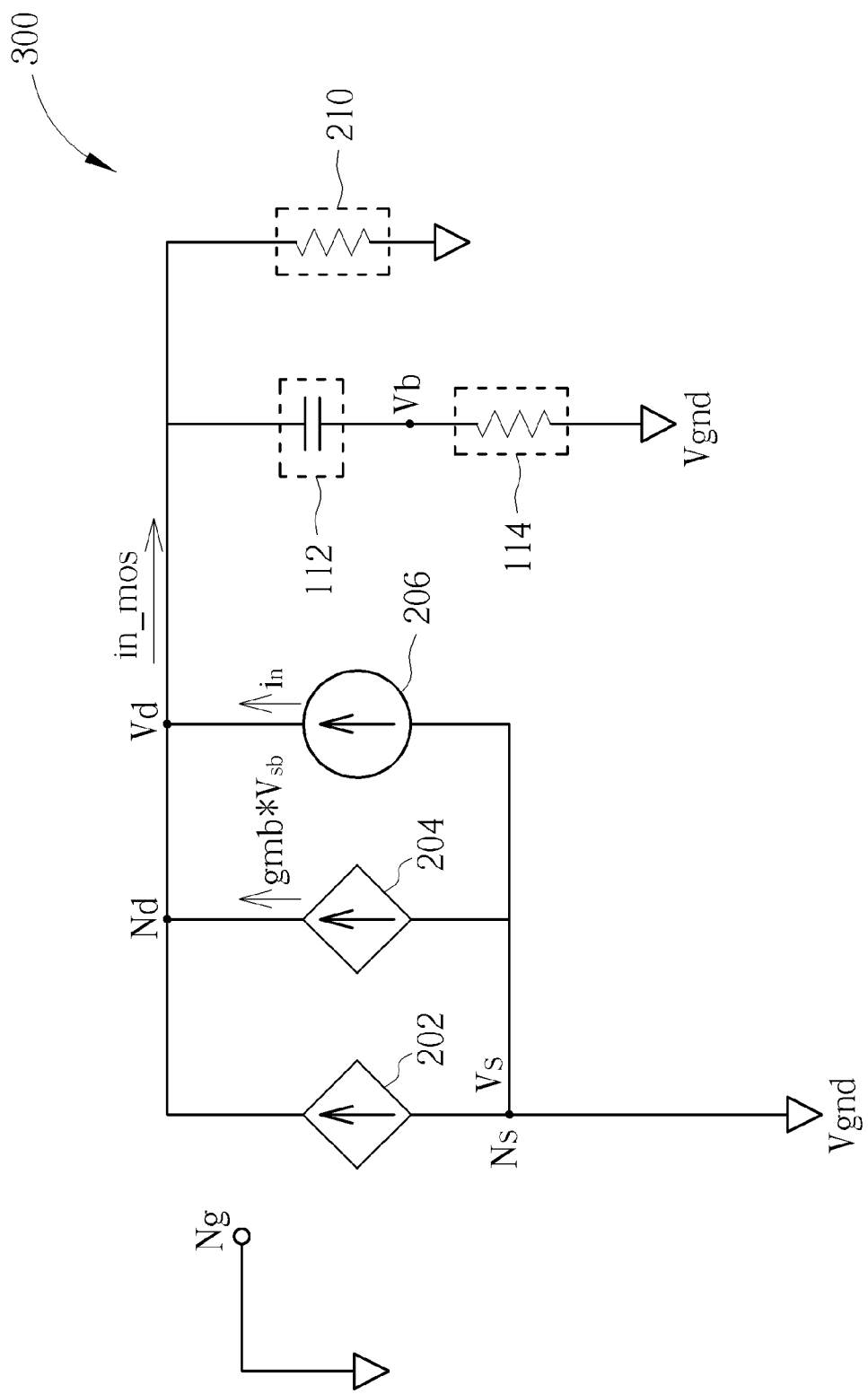
FIG. 3 is a diagram illustrating an AC signal equivalent circuit of the signal amplifying circuit according to a second embodiment of the present invention.

To analyze the noise of the present signal amplifying circuit 100, the AC signal equivalent circuit 200 of the signal amplifying circuit 100 is further simplified into FIG. 3, which is a diagram illustrating an AC signal equivalent circuit 300 of the signal amplifying circuit 100 according to another embodiment of the present invention. In FIG. 3, the input signal Sin is removed, and the first connecting terminal Ns is coupled to the ground voltage Vgnd. Therefore, the total noise current in_mos of the first transistor 102 can be deduced by the following equations:

$$in\_mos = i_n + gmb*v_{sb};$$

$$in\_mos*Rx = vd = vb;$$

$$vs = 0;$$

$$v_{sb} = -vb;$$

$$in\_mos = i_n/(1+gmb*Rx). \quad (3)$$

It is noted that the trans-conductance gm2 of the second transistor 106 is ignored in the above deduction. According to the equation (3), it is obtained that the noise current $i_n$ of the first transistor 102 is divided by the magnitude of (1+gmb*Rx). Therefore, by using the adjustable resistive circuit 104, the capacitive circuit 112, and the resistive circuit 114, the total noise current in_mos of the first transistor 102 is reduced.

Figure 4:
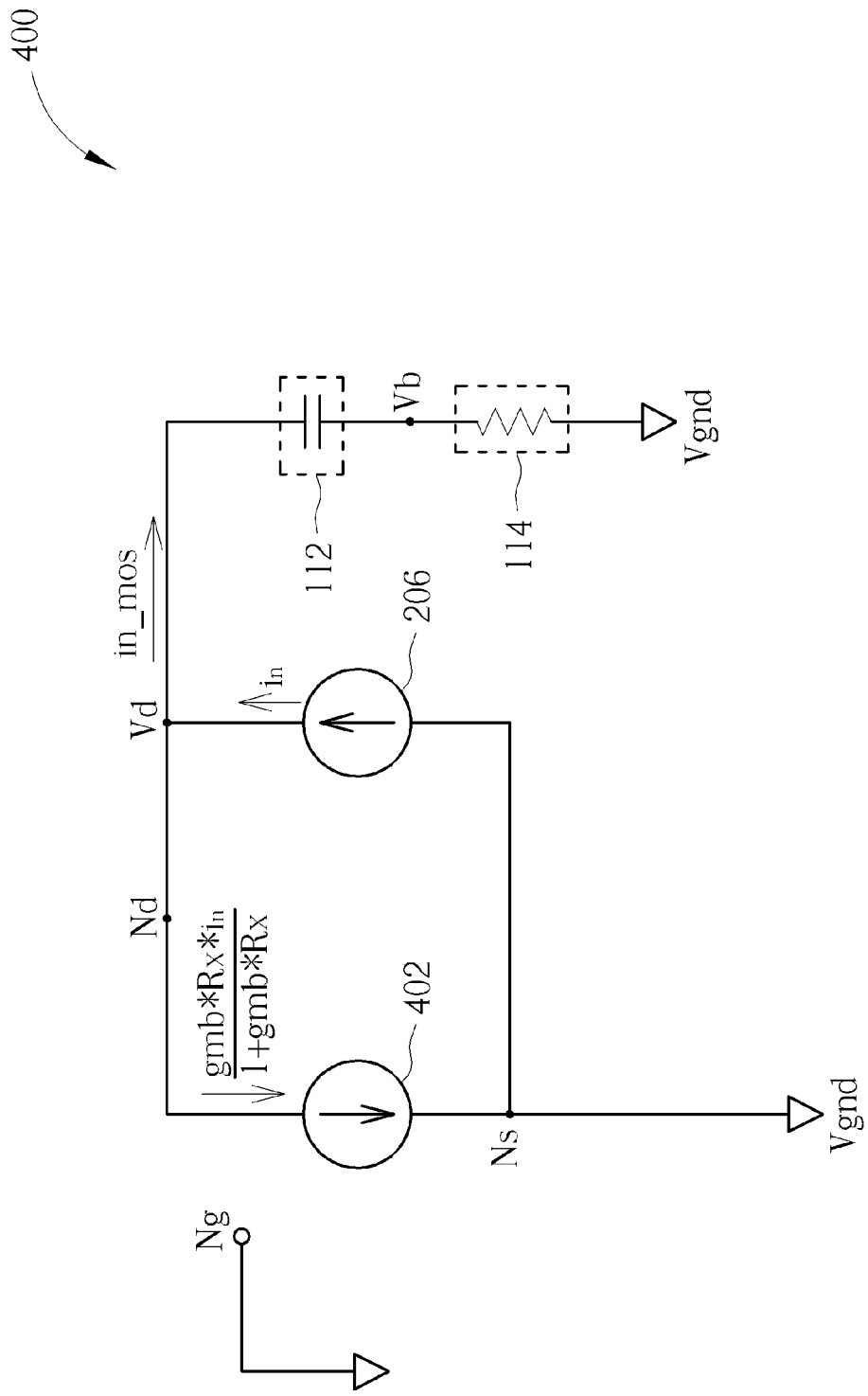
FIG. 4 is a diagram illustrating an AC signal equivalent circuit of the signal amplifying circuit according to a third embodiment of the present invention.

According to the equation (3), the AC signal equivalent circuit 200 of the signal amplifying circuit 100 can further be simplified into FIG. 4, which is a diagram illustrating an AC signal equivalent circuit 400 of the signal amplifying circuit 100 according to another embodiment of the present invention. In FIG. 4, an equivalent controllable current source 402 is coupled between the first connecting terminal Ns and the second connecting terminal Nd, and the controllable current source 204 and the resistive circuit 210 are removed. The equivalent controllable current source 402 provides a current of [(gmb*Rx)/(1+gmb*Rx)]*$i_n$ flowing from the second connecting terminal Nd to the first connecting terminal Ns. Therefore, it can be concluded that the equivalent controllable current source 402 generates a current of [(gmb*Rx)/(1+gmb*Rx)]*$i_n$ which is inverse to the noise current $i_n$ of the first transistor 102. Thus, the total noise current in_mos of the first transistor 102 is reduced.

Please refer to FIG. 1 again. The equivalent noise Inoise generated due to the components (e.g. the adjustable resistive circuit 104, the second transistor 106, and etc.) contribute to the output signal Sout via the main signal path of the signal amplifying circuit 100. Then, by using the arrangement of the feedback capacitive circuit 112 and the resistive circuit 114, an inverse current Ibs (i.e. [(gmb*Rx)/(1+gmb*Rx)]*$i_n$) is always generated in the opposite direction since the voltage level of the AC signal vb at the body of the first transistor 102 is higher than the voltage level of the input signal Sin at the source terminal of the first transistor 102. Thus, the present signal amplifying circuit 100 achieves better noise figure (NF) under the same matching condition in comparison with the conventional common-gate LNA.

Figure 5:
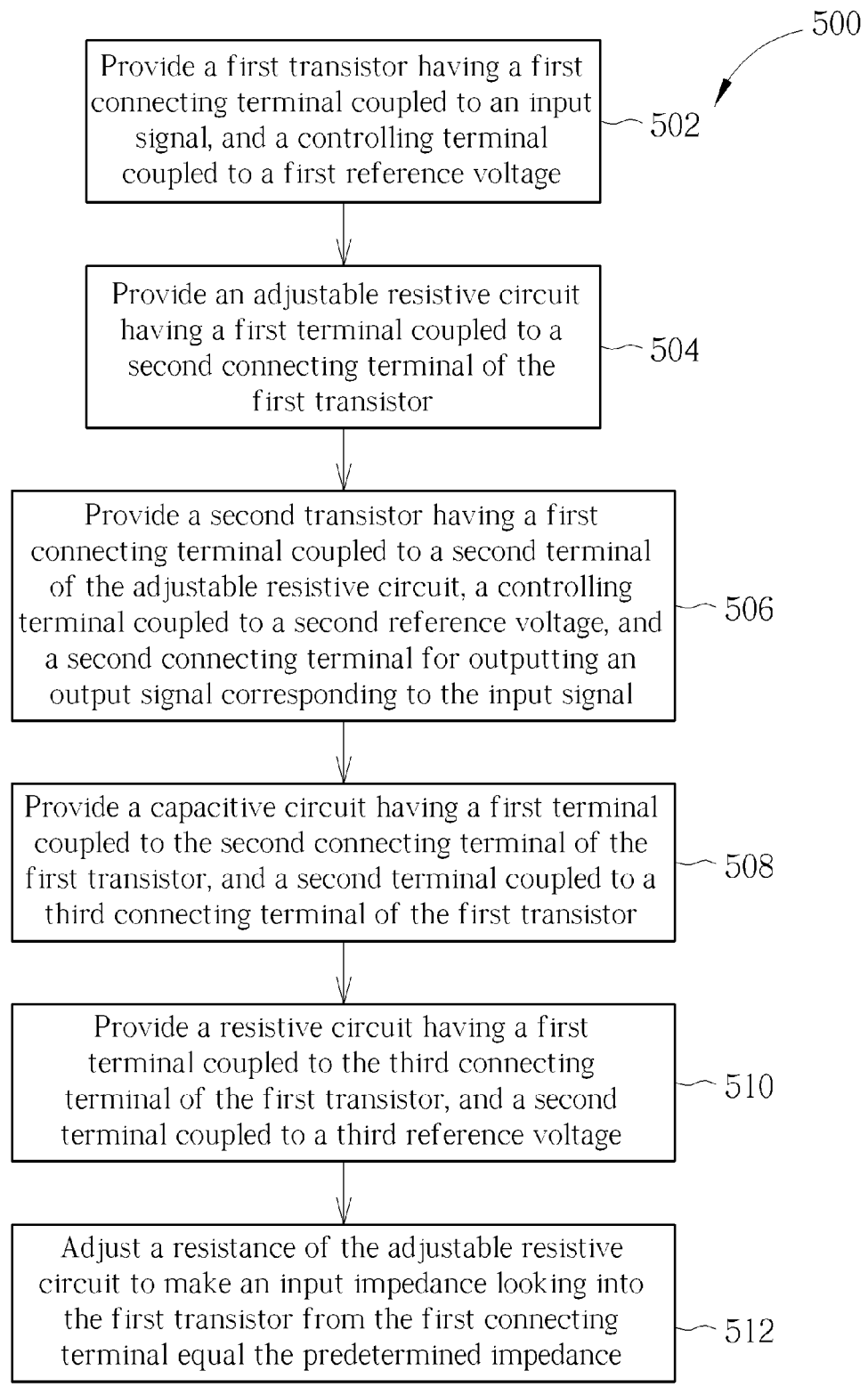
FIG. 5 is a flowchart illustrating a signal amplifying method according to a fourth embodiment of the present invention.

In views of the above description of the present signal amplifying circuit 100, the method of achieving good noise figure (NF) and good matching condition can be briefly summarized into the steps as shown in FIG. 5. FIG. 5 is a flowchart illustrating a signal amplifying method 500 according to a fourth embodiment of the present invention. Provided that substantially the same result is achieved, the steps of the flowchart shown in FIG. 5 need not be in the exact order shown and need not be contiguous, that is, other steps can be intermediate. The signal amplifying method 500 comprises:

Step 502: Provide the first transistor 102 having the first connecting terminal Ns coupled to the input signal Sin, and the controlling terminal Ng coupled to the first reference voltage Vref1;

Step 504: Provide the adjustable resistive circuit 104 having the first terminal coupled to the second connecting terminal Nd of the first transistor 102;

Step 506: Provide the second transistor 106 having the first connecting terminal coupled to the second terminal of the adjustable resistive circuit 104, the controlling terminal coupled to the second reference voltage Vref2, and the second connecting terminal for outputting the output signal Sout corresponding to the input signal Sin;

Step 508: Provide the capacitive circuit 112 having the first terminal coupled to the second connecting terminal Nd of the first transistor 102, and the second terminal coupled to the third connecting terminal Nb of the first transistor 102;

Step 510: Provide the resistive circuit 114 having the first terminal coupled to the third connecting terminal Nb of the first transistor 102, and the second terminal coupled to the third reference voltage Vgnd; and Step 512: Adjust the resistance of the adjustable resistive circuit 104 to make the input impedance $r_{in}$ looking into the first transistor 102 from the first connecting terminal Ns equal the predetermined impedance.

It is noted that the steps 502-512 summarize the inventive steps of the present signal amplifying circuit 100, thus the detailed description of the signal amplifying method 500 is omitted here for brevity.

Figure 6:
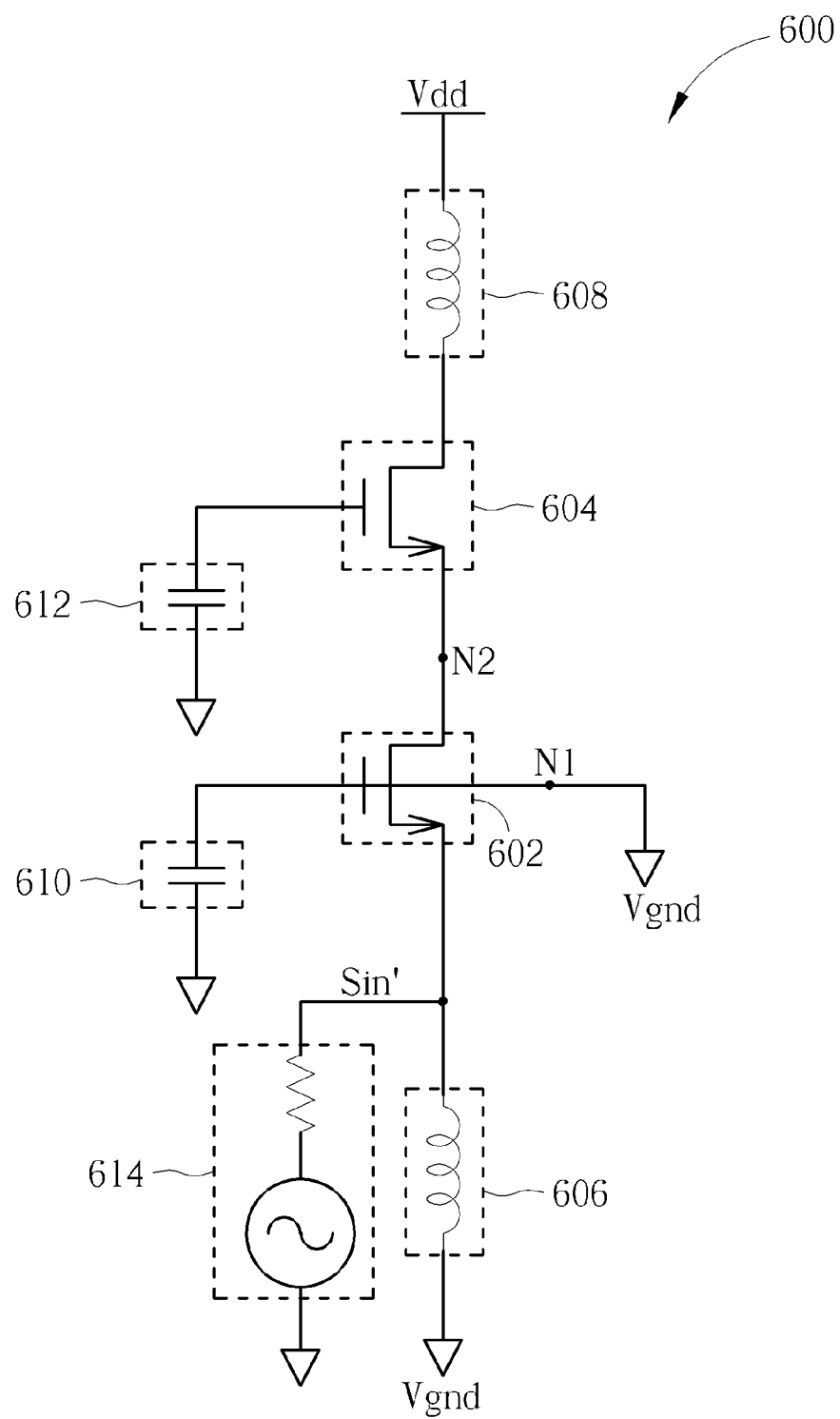
FIG. 6 is a diagram illustrating a well-known LNA.

Please refer to FIG. 6, which is a diagram illustrating a well-known LNA 600. It can be seen that the well-known LNA 600 comprises an N-type transistor 602, an N-type transistor 604, a first inductor 606, a second inductor 608, a first capacitor 610, and a second capacitor 612, in which the input signal Sin' is generated by a previous circuit stage illustrated as block 614. The connectivity of the well-known LNA 600 is illustrated in FIG. 6, thus the detailed description is omitted here for brevity. In comparison with the present signal amplifying circuit 100, the body N1 of the N-type transistor 602 in the well-known LNA 600 is directly connected to the ground voltage, and the drain (i.e. N2) of the N-type transistor 602 is directly connected to the source of the N-type transistor 604. Therefore, the input impedance looking into the source of the N-type transistor 602 is mainly decided by the trans-conductance (i.e. gm) of the N-type transistor 602. Consequently, the well-known LNA 600 always provides poor impedance matching condition at the source of the N-type transistor 602. Moreover, as the body N1 of the N-type transistor 602 is directly connected to the ground voltage and there is not feedback loop connected between the drain and the body N1 of the N-type transistor 602, the noise (e.g. the current $i_n$ in FIG. 2) generated by the N-type transistor 602 always flows to the output terminal of the well-known LNA 600. Thus, the well-known LNA 600 also provides poor noise figure.

Briefly, by arranging the adjustable resistive circuit 104 between the drain terminal of the first transistor 102 and the source terminal of the second transistor 106, the input impedance $r_{in}$ can be adjusted by adjusting the resistance Rx of the adjustable resistive circuit 104. The input return loss problem of the input signal Sin can thereby be improved. In addition, by further arranging the capacitive circuit to couple between the drain terminal and the body of the first transistor 102, and by arranging the resistive circuit 114 to couple between the body of the first transistor 102 and the ground voltage Vgnd, an inverse current Ibs is always generated in the opposite direction to reduce the equivalent noise Inoise. Thus, the present signal amplifying circuit 100 achieves better noise figure (NF).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal amplifying circuit, comprising:
    a first transistor, having a first connecting terminal coupled to an input signal, and a controlling terminal coupled to a first reference voltage;
    an adjustable resistive circuit, having a first terminal coupled to a second connecting terminal of the first transistor; and
    a second transistor, having a first connecting terminal coupled to a second terminal of the adjustable resistive circuit, a controlling terminal coupled to a second reference voltage, and a second connecting terminal for outputting an output signal corresponding to the input signal;
    wherein a resistance of the adjustable resistive circuit is adjusted to make an input impedance looking into the first transistor from the first connecting terminal equal a predetermined impedance.

2. The signal amplifying circuit of claim 1, wherein the input impedance is arranged to substantially equal a summation of an inverse of a trans-conductance (gm) of the first transistor and the resistance of the adjustable resistive circuit.

3. The signal amplifying circuit of claim 1, further comprising:
    a first inductive circuit, having a first terminal coupled to the first connecting terminal of the first transistor, and a second terminal coupled to a third reference voltage; and
    a second inductive circuit, having a first terminal coupled to the second connecting terminal of the second transistor, and a second terminal coupled to a fourth reference voltage.

4. The signal amplifying circuit of claim 1, being a common-gate low-noise amplifier.

5. The signal amplifying circuit of claim 1, wherein the predetermined impedance is an output impedance of a circuit used to generate the input signal.

6. The signal amplifying circuit of claim 1, further comprising:
    a capacitive circuit, having a first terminal coupled to the second connecting terminal of the first transistor, and a second terminal coupled to a third connecting terminal of the first transistor; and
    a resistive circuit, having a first terminal coupled to the third connecting terminal of the first transistor, and a second terminal coupled to a third reference voltage.

7. The signal amplifying circuit of claim 6, wherein the resistive circuit and the capacitive circuit are arranged to make a first AC (Alternating current) signal at the second connecting terminal of the first transistor substantially equal a second AC signal at the third connecting terminal of the first transistor.

8. The signal amplifying circuit of claim 6, wherein the resistive circuit and the capacitive circuit are arranged to be a low-pass circuit at the second connecting terminal of the first transistor, and a signal frequency of the input signal is higher than a corner frequency of the low-pass circuit.

9. The signal amplifying circuit of claim 6, wherein the first connecting terminal of the first transistor is a source terminal of the first transistor, the second connecting terminal of the first transistor is a drain terminal of the first transistor, the third connecting terminal of the first transistor is a body terminal of the first transistor, and the controlling terminal of the first transistor is a gate terminal of the first transistor.

10. The signal amplifying circuit of claim 6, wherein the third reference voltage is a ground voltage.

11. The signal amplifying circuit of claim 6, wherein a voltage level of an AC signal at the third connecting terminal of the first transistor is higher than a voltage level of the input signal at the first connecting terminal of the first transistor.

12. A signal amplifying method, comprising:
    providing a first transistor having a first connecting terminal coupled to an input signal, and a controlling terminal coupled to a first reference voltage;
    providing an adjustable resistive circuit having a first terminal coupled to a second connecting terminal of the first transistor;
    providing a second transistor having a first connecting terminal coupled to a second terminal of the adjustable resistive circuit, a controlling terminal coupled to a second reference voltage, and a second connecting terminal for outputting an output signal corresponding to the input signal; and
    adjusting a resistance of the adjustable resistive circuit to make an input impedance looking into the first transistor from the first connecting terminal equal a predetermined impedance.

13. The signal amplifying method of claim 12, wherein the predetermined impedance is an output impedance of a circuit used to generate the input signal.

14. The signal amplifying method of claim 12, further comprising:
    providing a capacitive circuit having a first terminal coupled to the second connecting terminal of the first transistor, and a second terminal coupled to a third connecting terminal of the first transistor; and
    providing a resistive circuit having a first terminal coupled to the third connecting terminal of the first transistor, and a second terminal coupled to a third reference voltage.

15. The signal amplifying method of claim 14, further comprising:
    arranging the resistive circuit and the capacitive circuit are arranged to make a first AC (Alternating current) signal at the second connecting terminal of the first transistor substantially equal a second AC signal at the third connecting terminal of the first transistor.

16. The signal amplifying method of claim 14, further comprising:
    arranging the resistive circuit and the capacitive circuit to be a low-pass circuit at the second connecting terminal of the first transistor, and
    arranging a signal frequency of the input signal to higher than a corner frequency of the low-pass circuit.

17. The signal amplifying method of claim 14, further comprising:

arranging a voltage level of an AC signal at the third connecting terminal of the first transistor to higher than a voltage level of the input signal at the first connecting terminal of the first transistor.

* * * * *